United States Patent
Blanchard

(10) Patent No.: US 7,998,780 B2
(45) Date of Patent: Aug. 16, 2011

(54) THINNED IMAGE SENSOR WITH TRENCH-INSULATED CONTACT TERMINALS

(75) Inventor: Pierre Blanchard, Echirolles (FR)

(73) Assignee: E2V Semiconductors, Saint-Egreve (FR)

( * ) Notice: Subject to any disclaimer, the term of this patent is extended or adjusted under 35 U.S.C. 154(b) by 331 days.

(21) Appl. No.: 12/158,947

(22) PCT Filed: Nov. 6, 2006

(86) PCT No.: PCT/EP2006/068107
§ 371 (c)(1),
(2), (4) Date: Nov. 24, 2008

(87) PCT Pub. No.: WO2007/071491
PCT Pub. Date: Jun. 28, 2007

(65) Prior Publication Data
US 2009/0263931 A1    Oct. 22, 2009

(30) Foreign Application Priority Data
Dec. 23, 2005 (FR) ...................................... 05 13221

(51) Int. Cl.
*H01L 21/00* (2006.01)

(52) U.S. Cl. ................ 438/64; 438/65; 438/69; 438/98; 257/290; 257/444; 257/E31.11; 257/E31.103

(58) Field of Classification Search .................... 438/57, 438/64, 65, 69, 98; 257/290, 291, 444, E31.11, 257/E31.103
See application file for complete search history.

(56) References Cited

U.S. PATENT DOCUMENTS
2005/0104148 A1    5/2005    Yamamoto et al.

FOREIGN PATENT DOCUMENTS
EP    1693902    8/2006
JP    2005167090 A    6/2005

*Primary Examiner* — Hsien-ming Lee
(74) *Attorney, Agent, or Firm* — Lowe Hauptman Ham & Berner, LLP

(57) ABSTRACT

The invention relates to the fabrication of thinned substrate image sensors, and notably color image sensors. After the fabrication steps carried out from the front face of a silicon substrate the front face is transferred onto a substrate. The silicon is thinned, and the connection terminals are produced by the rear face. A multiplicity of localized contact holes are opened through the thinning silicon, in the location of a connection terminal. The holes exposing a first conductive layer (24) are formed during the front face steps. Aluminum (42) is deposited on the rear face, in contact with the silicon, with the aluminum penetrating into the openings and coming into contact with the first layer. The aluminum is etched to delimit the connection terminal. Finally, a peripheral trench is opened through the entire thickness of the silicon layer, and this trench completely surrounds the connection terminal.

15 Claims, 3 Drawing Sheets

THINNED IMAGE SENSOR WITH TRENCH-INSULATED CONTACT TERMINALS

CROSS-REFERENCE TO RELATED APPLICATIONS

The present Application is based on International Application No. PCT/EP2006/068107, filed on Nov. 6, 2006, which in turn corresponds to French Application No. 05/13221 filed on Dec. 23, 2005, and priority is hereby claimed under 35 USC §119 based on these applications. Each of these applications are hereby incorporated by reference in their entirety into the present application.

FIELD OF THE INVENTION

The invention relates to the fabrication of thinned substrate image sensors, and notably color image sensors.

BACKGROUND OF THE INVENTION

Thin substrate image sensors were designed to improve the calorimetric performance characteristics of the sensors by enabling the sensor to be lit by the rear face through a very thin silicon layer; this arrangement provides a way of avoiding the dispersion of the photons and of the electrons photogenerated in the substrate, and therefore avoiding image crosstalk which would greatly impair the colorimetry since the pixels of adjacent images correspond to different colors.

The fabrication of an image sensor on thinned substrate generally comprises the following steps: the process begins with a silicon substrate (solid monocrystalline or silicon on insulator SOI substrate, for example), with a thickness of a few hundreds of micrometers, supporting the industrial manipulation of wafers of ten or twenty centimeters in diameter, this substrate being coated on a front face with an epitaxial layer of monocrystalline silicon which will contain the active circuits of the sensor. In this epitaxial layer, from the front face, the electronic circuitry needed for the various functions of the sensor (image capture, signal processing) is produced. Then, the substrate is glued, by its front face which supports this circuitry, onto a transfer substrate of sufficient thickness for industrial manipulation, and the original silicon substrate is thinned to a thickness of a few micrometers. The very fine thickness of silicon that results from this would not allow for industrial manipulation of the wafer, and this explains the presence of the glued transfer substrate. The very fine thickness, in the case of a color image sensor, serves to considerably enhance the calorimetric qualities of the sensor, the sensor being lit by the rear face, through a layer of colored filters deposited on this rear face and through the very fine layer of epitaxial silicon.

One of the problems encountered in this technology is that of producing contact terminals to provide external electrical connection for the sensor.

One solution already proposed consists in providing contact metallizations in processing steps performed on the front face, and then cutting out, in the thinned silicon, from the rear face, wide and deep openings that expose these metallizations. A solder wire can then be soldered to the metallizations inside these openings. However, this often requires the provision of wide openings (typically 120 to 180 micrometers in width). The total width of the terminals formed in this way is then far greater than the width conventionally provided for connection terminals of conventional CMOS electronic circuits (typically, terminals 60 micrometers wide are sufficient).

Furthermore, the openings must be made before the color filters are deposited onto the sensor; now, the presence of these openings disrupts the uniformity of distribution of the filtering layers; furthermore, the deposition of these filtering layers will leave residues in the openings that cannot easily be removed although it is essential to remove them to ensure the soldering of the connection wires.

Another solution could be envisaged, consisting in forming openings when processing a front face, that is, before the transfer onto a transfer substrate; the openings are made at the position of the connection terminals, through the entire depth which remains after thinning, and the bottom of these openings is metallized. After transfer and thinning, the metallized bottom is accessible on the thinned rear face and constitutes the connection terminal, this time in the same plane as the exit face and not at the bottom of an opening. However, such a method requires steps that are not conventional in a typical CMOS industrial method in that the silicon trenches supporting the sensors could not easily be inserted into an industrial production where both sensors of this type and more conventional circuits (non-thinned substrates) must be produced.

SUMMARY OF THE INVENTION

To avoid the drawbacks of the known methods, the present invention proposes a novel method of fabricating an image sensor with thinned silicon substrate, comprising fabrication steps carried out from the front face of a silicon substrate then the transfer of the front face onto a transfer substrate then the thinning of the silicon substrate to a thickness of a few micrometers (typically between 3 and 20 micrometers), and finally fabrication steps carried out on the rear face of the thinned silicon substrate, this method being characterized in that the fabrication steps carried out from the rear face comprise:

the etching of at least one localized contact opening through the thinned substrate, on a surface area reserved for the creation of an external connection terminal for the sensor, the opening locally exposing a first conductive layer formed during the fabrication steps carried out from the front face;

the deposition of a second conductive layer on the rear face, in contact with the silicon in the opening, the second layer coming into contact with the first layer;

the etching of the second layer to delimit a connection terminal;

the opening of a peripheral trench through the entire thickness of the thinned silicon substrate to an insulating layer located under this substrate, this trench completely surrounding the connection terminal and the bottom of the trench being entirely formed by the insulating layer, so forming an island of thinned silicon covered by the connection terminal and insulated by the trench from the rest of the thinned silicon.

Because of the peripheral trench, there is no need to use an insulating layer to insulate the second conductive layer of the silicon and this is why the second conductive layer is deposited directly in contact with the silicon.

A wire can then be soldered to a part of the connection terminal. The part of the connection terminal to which the wire is soldered preferably has no openings.

An insulating planarization layer is preferably deposited on the rear face after opening the trench, and an opening is etched in this layer to release a portion of surface area of the connection terminal, to which a wire can be soldered.

Preferably, several localized contact openings are provided through the thinned substrate to create a series of localized contacts with the first underlying conductive layer.

The trench is preferably cut out after etching of the second conductive layer.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWING

Figure 1:
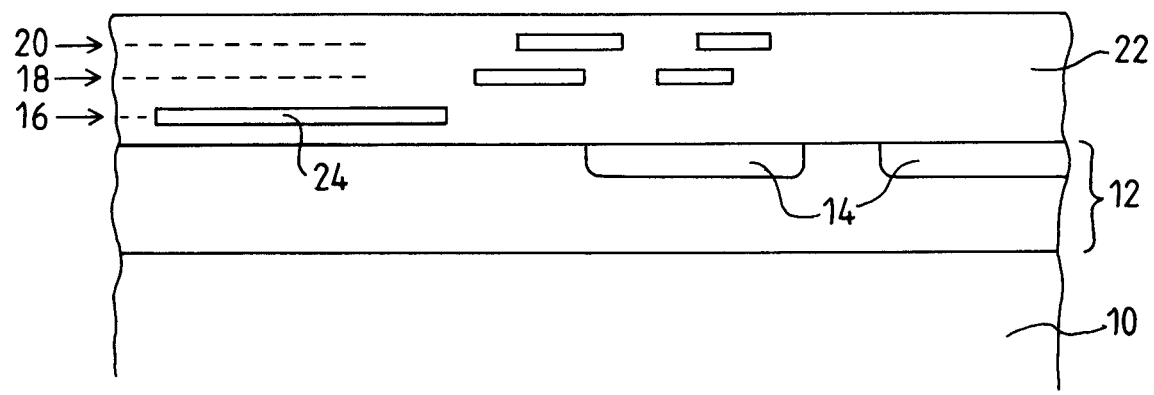
FIGS. 1 to 8 illustrate the main successive steps of the inventive method.

FIG. 1 shows a silicon substrate 10 comprising a surface epitaxial layer 12 in which will be produced the active elements of the integrated circuit, and notably the photosensitive elements of the image sensor. The electronic circuits of the sensor, comprising for example a photosensitive active matrix and peripheral circuits, are fabricated by conventional operations involving depositing, etching, doping, different insulating, conductive or semiconductive layers, and all these operations are carried out from the front face of the substrate, namely the face on which the epitaxial layer is located. The substrate 10 can be a substrate of solid monocrystalline silicon or a substrate of SOI (silicon on insulator) type comprising an epitaxial layer separated from the substrate by a fine layer of silicon oxide.

Diagrammatically represented on the front face are the epitaxial layer 12 with doped semiconductive areas 14, and, above the epitaxial layer 12, several levels of superimposed conductive layers 16, 18, 20, separated from each other by insulating layers. The conductive layers are etched according to desired patterns dictated by the functionality of the circuit, and can be linked in places to each other by conductive vias through the insulating layers. The insulating layers are globally designated 22 without distinguishing them from each other although they are deposited and etched successively in alternating conductive layers and insulating layers.

The sensor therefore appears overall, at the end of the fabrication steps on the front face, as a silicon substrate 10 coated with an epitaxial layer 12 notably comprising different doping patterns, this epitaxial layer itself being coated with an insulating layer 22 in which are embedded several etched conductive levels. The top face of the layer 22 is flat, notably because an insulating planarization layer was able to be deposited last on the substrate.

Among the conductive layers, a layer 16 is provided in which conductive lands 24 are formed in areas that correspond geographically to terminals intended for external connection of the sensor. Since the connection terminals are more often than not at the periphery of a chip, the conductive lands 24 are in principle located at the periphery of the chip. The conductive land 24, in the position of the terminal, is separated from the epitaxial layer 12 by a small thickness of insulating layer. The conductive layer 16 can be of aluminum. The insulating layers are principally of silicon oxide, but there can be other insulating materials in the layer 22. The conductive land 24 can be relatively extensive (with a side dimension of several tens of micrometers), continuous or in open grid configuration, or it can even be of small dimensions (a few micrometers) if the currents carried by the terminals are low.

The integrated circuit that has thus undergone the necessary processing operations from the front face is now glued, by this front face, onto the front face of a transfer substrate 30. It will be noted that this operation is carried out on the silicon wafers and not after the wafer has been cut into individual chips. Before the gluing, the necessary planarization operations are carried out to ensure that the wafer and the transfer substrate adhere perfectly to each other, especially if the gluing is done by molecular adhesion without the addition of adhesive material.

Figure 2:
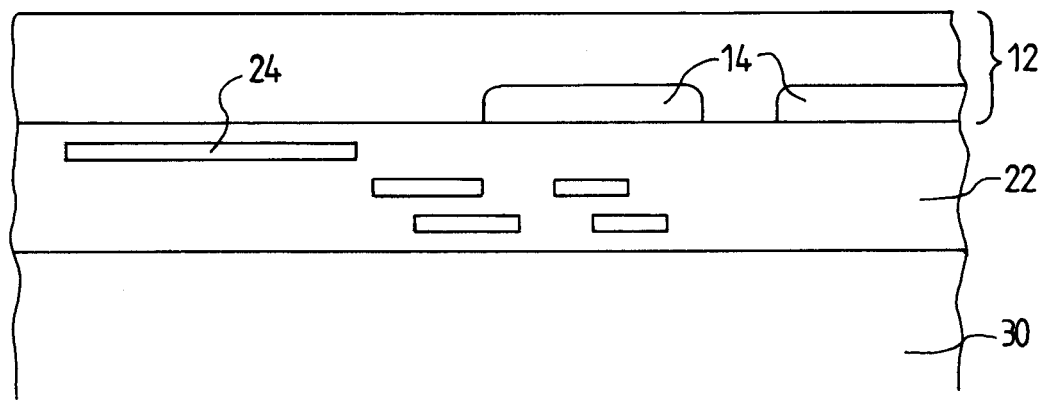

Then after gluing, the silicon of the substrate 10 is thinned by its rear face, by mechanical and chemical machining operations, so as to leave only a very small thickness of silicon remaining; practically, only the epitaxial layer 12 (or scarcely more than the epitaxial layer) is left, i.e. a few micrometers. FIG. 2 represents the thin remaining silicon layer 12, turned over and glued by its front face (turned downward) onto the front face (turned upward) of the transfer substrate 30.

The transfer substrate 30 now provides the mechanical strength for the wafer. Various processing operations, and notably the operations needed to produce connection terminals for the external connection of the circuit, are then carried out from the rear face of the epitaxial layer (at the top in FIG. 2).

Figure 3:
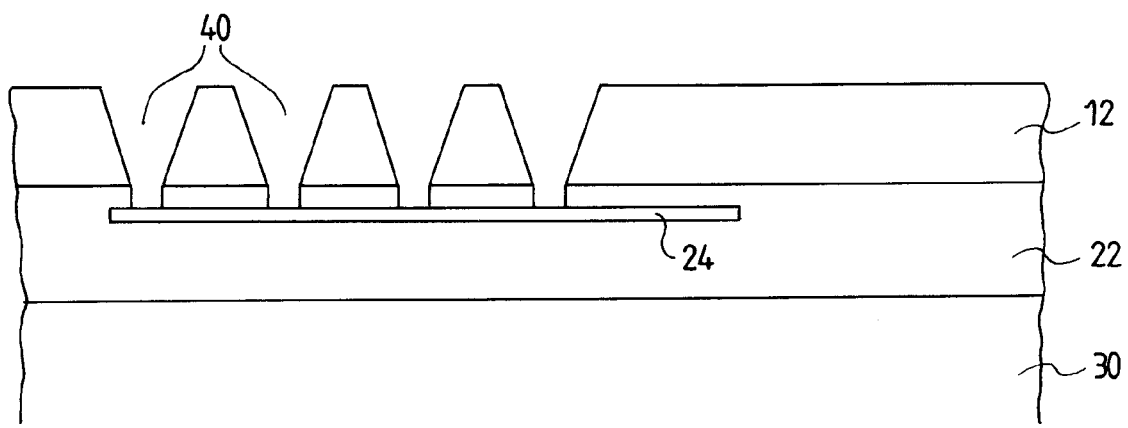

For this, a series of openings 40, distributed above each of the conductive lands 24 that are intended to be electrically linked to the connection terminals, are opened through the entire thickness of the epitaxial layer 12. In certain cases, a single opening 40 may be sufficient; in all cases, the openings are located above conductive parts of the land 24. FIG. 3 represents a view of the part of the integrated circuit which comprises a land 24 and the openings 40 formed above this land. Only a small number of localized openings is represented to simplify the figure. After having etched these openings through the entire thickness of the silicon of the layer 12, the openings are completed by removing the portions of insulating layer 22 located at the bottom of the openings, to reveal the conductive land 24.

A conductive layer 42, for example of aluminum, is then deposited. Hereinafter, the layer 16 (the one that contains the conductive land 24) will be called first conductive layer and the layer 42 will be called second conductive layer, the two conductive layers helping to form an external connection terminal for the integrated circuit. The deposition of the second conductive layer 42 can be preceded by a step for surface doping the silicon.

Figure 4:
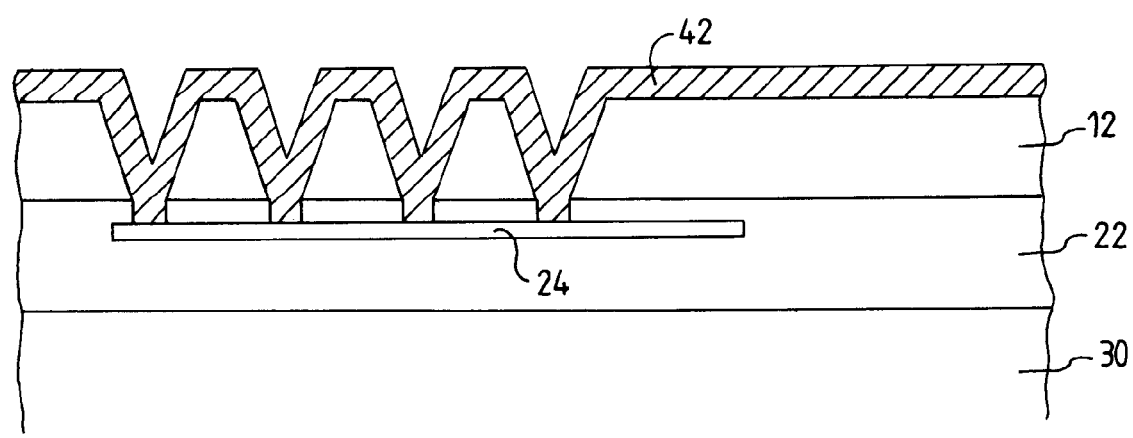

The second conductive layer 42 fills the openings and comes into contact through each of these openings with the first conductive layer forming the land 24 (FIG. 4).

Figure 5:
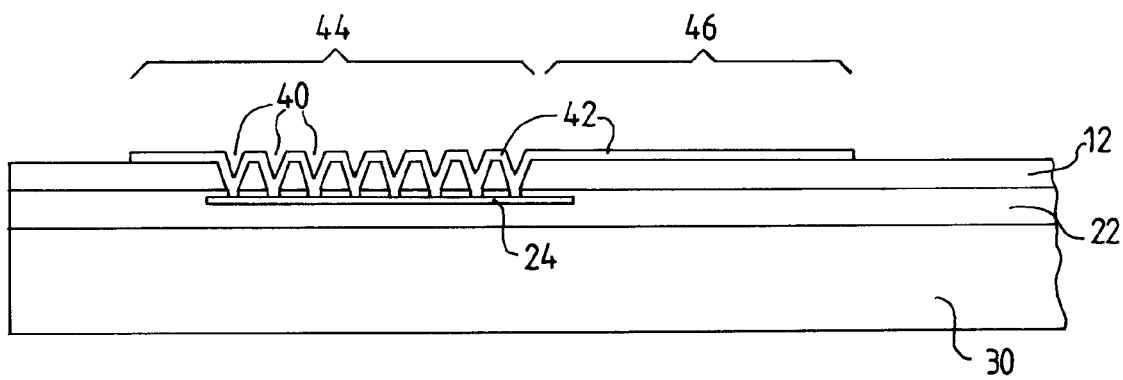

After this deposition, the second conductive layer 42 is etched to delimit an external connection terminal. FIG. 5 represents a general view of the connection terminal, preferably with a part 44 (on the left in the figure) perforated with openings distributed above the land 24 and another part 46 not perforated with openings (on the right) which will be reserved for soldering a connection wire. It will be noted that, if the individual openings are small enough, it is also possible to envisage having a connection terminal with the entire surface area comprising a regular distribution of openings, the wire then being soldered on a metallic surface area which includes the relief generated by the openings 40; the land 24 would then occupy most or all of the surface area located under the connection terminal.

Figure 6:
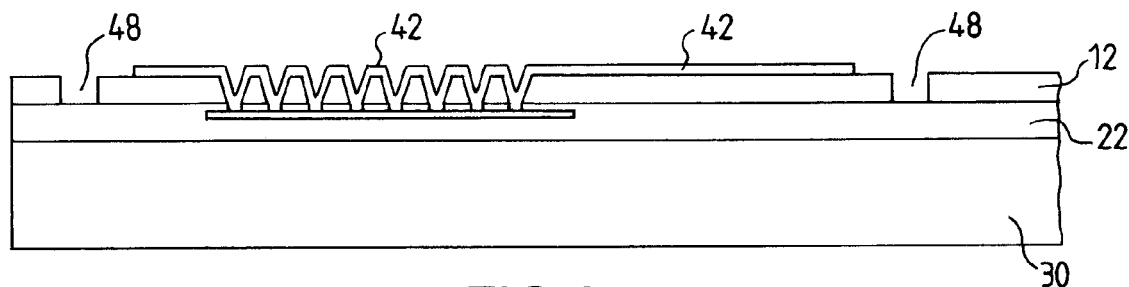

FIG. 6 represents the following step: a peripheral trench 48 is etched, completely surrounding the connection terminal, through the entire depth of the epitaxial layer, to the insulating layer 22. This trench stops at the insulating layer 22 and does not descend as far as a portion of metallic layer, so that the bottom of the trench is entirely formed by an insulating surface.

Figure 7:
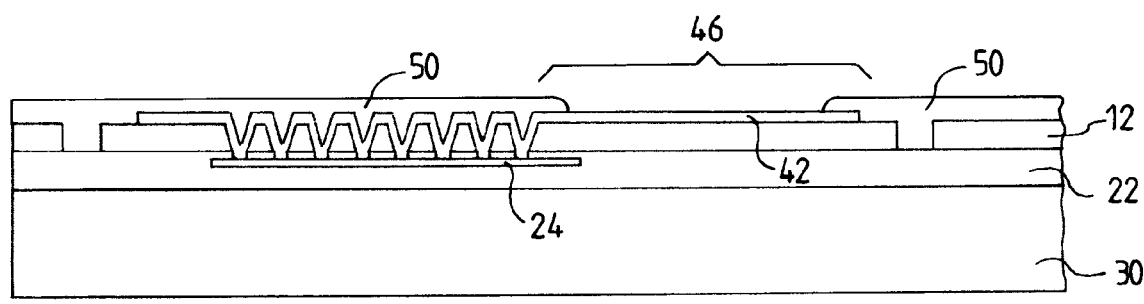

The following step, FIG. 7, is not mandatory but it is preferable. It comprises the deposition of an insulating protective layer 50 and the opening of this layer above the center of the conductive connection terminal (therefore in principle in the part 46 of the terminal if a part not perforated with openings and reserved for the soldering of a wire has been provided). The insulating layer 50 fills the peripheral trench 48.

The conventional steps for deposition and photoetching of the colored filters are not represented.

Figure 8:
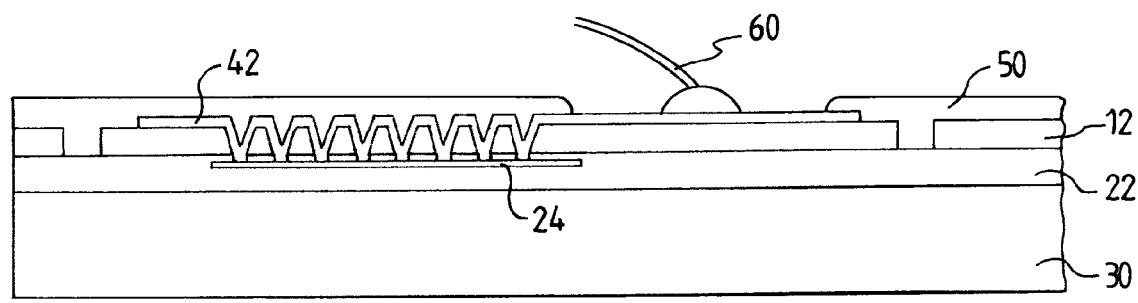

Finally, after cutting the wafer into individual chips, the final fabrication step will comprise the soldering of a connection wire 60 to the metal 42 of the connection terminal at the part where it is exposed (FIG. 8).

Figure 9:
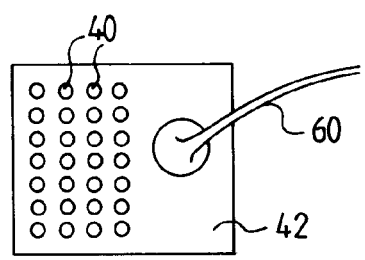
FIG. 9 represents a plan view of the general configuration of the connection terminal with its multiple contact openings.

The general appearance of the connection terminal with its multiple contact holes with the underlying layer 24 and with the part without holes is represented in plan view in FIG. 9. Several tens of holes of small dimensions (with a diameter or side dimension of a few micrometers) are preferably provided, but as stated previously, a single hole may suffice in certain cases.

A connection terminal has thus been produced without the need to deposit an insulating layer on the sides of the openings 40 before depositing the connection metal 42. The metal 42 is in contact with the silicon, but the silicon is insulated by the trench from the rest of the epitaxial layer which contains the active circuits; thus, the potentials applied to a terminal either from outside or from inside the integrated circuit do not affect the rest of the circuit or the other terminals.

Whether or not there is a final protective layer 50, the spreading of resin or of filtering layers is not hampered by the existence of the connection terminals. These are hollow when there is a layer 50 but the level difference between the surface of the terminal and the surface of the layer 50 is small. If there is no layer 50, the openings 40, which are moreover partially filled by the metal, are of small dimensions (with a side or diameter dimension of a few micrometers) and do not hamper the spreading. Furthermore, the absence of recess between the surface of the connection terminal and the surrounding surface makes it possible to limit the dimensions of the terminal to a side dimension of approximately 50 to 60 micrometers, a limitation that could not be envisaged with a metal surface too deep relative to the top surface of the integrated circuit chip.

The openings 40 are preferably formed by chemical attack on the silicon; the openings then have angled sides, the angle corresponding to the natural cleavage planes of the silicon (55°). The trench 48 is preferably etched by vertical anisotropic attack (plasma etching) and its lateral sides are vertical. Its width can be a few micrometers (from 1 to 3 micrometers for example). The trench 48 is not made at the same time as the openings 40 (although this is theoretically possible), so that it is not filled with aluminum when the layer 42 is deposited, because it would then be difficult to eliminate the aluminum from the bottom of the trench when etching to delimit the connection terminal.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method of fabricating an image sensor with thinned silicon substrate, comprising the steps of:
  providing a front surface of a silicon substrate;
  depositing at least one insulating layer and a first patterned conductive layer onto said front surface;
  transferring the front surface of the silicon substrate onto a transfer substrate;
  thinning the silicon substrate down to a thickness of a few micrometers;
  forming at least one localized contact opening on a rear surface of the thinned silicon substrate, wherein the at least one localized contact opening is located within a surface area for an external connection terminal of the image sensor and the at least one localized contact opening further exposes a portion of said first patterned conductive layer;
  depositing a second conductive layer on the rear surface of the thinned silicon substrate, said second conductive layer contacting the thinned silicon substrate in said surface area and contacting the first patterned conductive layer in the at least one localized contact opening;
  etching the second conductive layer to form a localized external connection terminal of the image sensor, said localized external connection terminal entirely comprised within said surface area; and
  forming a peripheral trench through the entire thickness of the thinned silicon substrate to said insulating layer located under the thinned silicon substrate, the peripheral trench completely surrounding said surface area for an external connection terminal, wherein a bottom of the peripheral trench is entirely formed by the insulating layer, so as to form an island of the thinned silicon substrate having the localized external connection terminal formed thereon, said island being insulated from remaining portions of the thinned silicon substrate outside said surface area.

2. The method as claimed in claim 1, wherein a wire is soldered to a part of the localized external connection terminal.

3. The method as claimed in claim 2, wherein said at least one localized contact opening is formed outside the part of the localized external connection terminal to which the wire is soldered.

4. The method as claimed in claim 1, further comprising depositing an insulating protective layer on the rear surface of the thinned silicon substrate after forming the peripheral trench;
  forming an opening through the insulating protective layer to expose a portion of the surface area of the localized external connection terminal; and soldering a wire to said portion of the surface area of the localized external connection terminal.

5. The method as claimed in claim 1, wherein the forming of said at least one localized contact opening comprises:
chemical etching from the rear surface of the thinned silicon substrate; and
forming the peripheral trench is made after etching the second conductive layer.

6. The method as claimed in claim 1, comprising forming the peripheral trench by a vertical anisotropic etching process.

7. The method as claimed in claim 1, further comprising forming a series of localized contact openings through the thinned silicon substrate, the series of localized contact openings being distributed above a conductive land of the first patterned conductive layer, the conductive land being electrically connected to the localized external connection terminal of the image sensor through all openings of the series.

8. The method as claimed in claim 2, further comprising:
depositing an insulating protective layer on the rear surface of the thinned silicon substrate after forming the peripheral trench;
forming an opening through the insulating protective layer to expose a portion of the surface area of the localized external connection terminal; and
soldering a wire to said portion of the surface area of the localized external connection terminal.

9. The method as claimed in claim 3, further comprising:
depositing an insulating protective layer on the rear surface of the thinned silicon substrate after forming the peripheral trench;
forming an opening through the insulating protective layer to expose a portion of the surface area of the localized external connection terminal; and
soldering a wire to said portion of the surface area of the localized external connection terminal.

10. The method as claimed in claim 2, wherein the forming of said at least one localized contact opening comprises:
chemical etching from the rear surface of the thinned silicon substrate; and
forming the peripheral trench is made after etching the second conductive layer.

11. The method as claimed in claim 3, wherein the forming of said at least one localized contact opening comprises chemical etching from the rear surface of the thinned silicon substrate; and forming the peripheral trench is made after etching the second conductive layer.

12. The method as claimed in claim 2, comprising forming the peripheral trench by a vertical anisotropic etching process.

13. The method as claimed in claim 3, comprising forming the peripheral trench by a vertical anisotropic etching process.

14. The method as claimed in claim 2, further comprising forming a series of localized contact openings through the thinned silicon substrate, the series of localized contact openings being distributed above a conductive land of the first patterned conductive layer, the conductive land being electrically connected to the localized external connection terminal of the image sensor through all openings of the series.

15. The method as claimed in claim 3, further comprising forming a series of localized contact openings through the thinned silicon substrate, the series of localized contact openings being distributed above a conductive land of the first patterned conductive layer, the conductive land being electrically connected to the localized external connection terminal of the image sensor through all openings of the series.

* * * * *